United States Patent [19]
Nakamura

[11] Patent Number: 5,433,169
[45] Date of Patent: Jul. 18, 1995

[54] METHOD OF DEPOSITING A GALLIUM NITRIDE-BASED III-V GROUP COMPOUND SEMICONDUCTOR CRYSTAL LAYER

[75] Inventor: Shuji Nakamura, Anan, Japan

[73] Assignee: Nichia Chemical Industries, Ltd., Tokushima, Japan

[21] Appl. No.: 223,739

[22] Filed: Apr. 6, 1994

Related U.S. Application Data

[63] Continuation-in-part of Ser. No. 780,469, Oct. 22, 1991, Pat. No. 5,334,277.

[30] Foreign Application Priority Data

Oct. 25, 1990 [JP] Japan ................ 2-288665
Mar. 13, 1991 [JP] Japan ................ 3-074822

[51] Int. Cl.$^6$ ........................................ C30B 25/14
[52] U.S. Cl. .................................. 117/102; 117/89; 117/93; 117/105; 117/952
[58] Field of Search ............. 117/102, 952, 93, 89, 117/105

[56] References Cited

U.S. PATENT DOCUMENTS

| | | | |
|---|---|---|---|
| 3,617,371 | 11/1971 | Burmeister | 156/611 |
| 3,701,682 | 10/1972 | Gortman et al. | 156/611 |
| 3,922,475 | 11/1975 | Manasevit | |
| 4,473,938 | 10/1984 | Kobayashi et al. | 156/DIG. 99 |
| 4,489,041 | 12/1984 | Wong | 422/186 |
| 4,518,455 | 5/1985 | Muething | 156/611 |
| 4,748,135 | 5/1988 | Frijlink | 156/611 |
| 4,812,231 | 3/1989 | Horooka et al. | 427/255 |
| 4,907,534 | 3/1990 | Huang et al. | 118/725 |

FOREIGN PATENT DOCUMENTS

| | | |
|---|---|---|
| 767703 | 1/1986 | European Pat. Off. |
| 254651 | 1/1988 | European Pat. Off. |
| 254654 | 1/1988 | European Pat. Off. |
| 328417 | 8/1989 | European Pat. Off. |
| 343355 | 11/1989 | European Pat. Off. |

OTHER PUBLICATIONS

H. Amano et al. "Metalorganic vapor phase epitaxial . . ." Appl. Phys. Lett. 48(5), 3 Feb. 1986, pp. 353–355.

M. Hashimoto. "Effects of hydrogen in an ambient on the crystal growth . . ." Journal of Crystal Growth 68, (1984), pp. 163–168.

E. Woelk & H. Beneking. "A novel movpe reactor with a rotating substrate" Journal of Crystal Growth 93, (1988), pp. 216–219.

S. Zembutsu & T. Sasaki. "Growth of GaN crystal films using electron . . ." Appl. Phys. Lett. 48, (13), 31 Mar. 1986, pp. 870–872.

Y. Ohki et al. "Fabrication and properties of a practical . . ." Inst. Phys. Conf. Ser. No. 63, Chapter 10, Paper presented at Int Symp. GaAs and Related compounds, Japan 1981.

C. Goodings et al. "A new inlet design for horizontal movpe reactors" Journal of Crystal Growth 96, (1989), pp. 13–18.

*Primary Examiner*—Robert Kunemond
*Attorney, Agent, or Firm*—Nixon & Vanderhye

[57] ABSTRACT

A method of depositing a gallium nitride-based III-V Group compound semiconductor crystal layer over a substrate by a metalorganic chemical vapor deposition technique. A reaction gas is supplied to a surface of a heated substrate in a direction parallel or oblique to the substrate. The gallium nitride-based III-V Group compound semiconductor crystal layer is grown on the heated substrate, while introducing a pressing gas substantially in a vertical direction toward the substrate to press the reaction gas against the entire surface of the substrate, under atmospheric pressure or a higher pressure.

13 Claims, 1 Drawing Sheet

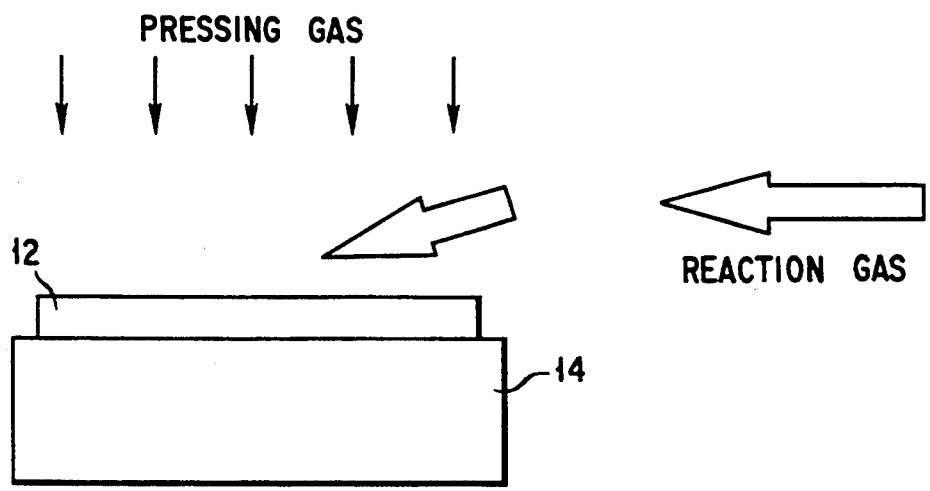
F I G. 1
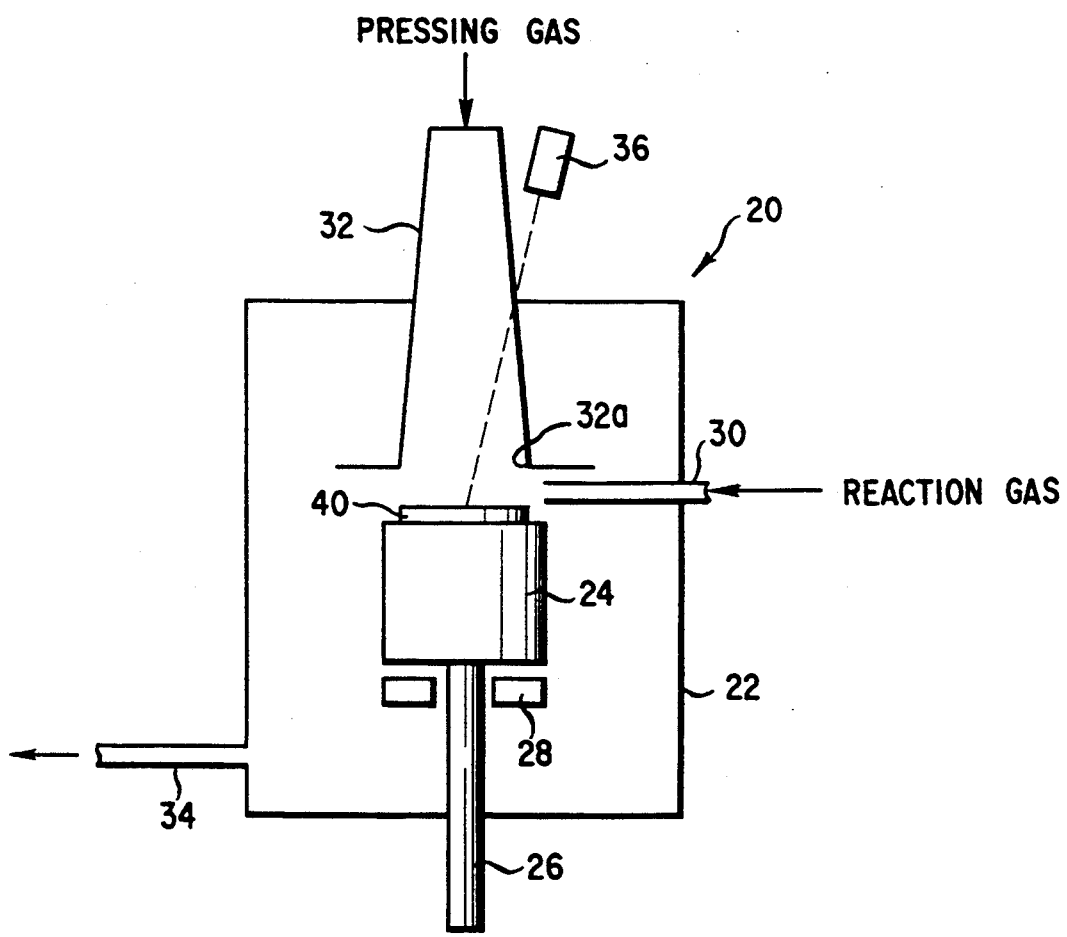
F I G. 2

METHOD OF DEPOSITING A GALLIUM NITRIDE-BASED III-V GROUP COMPOUND SEMICONDUCTOR CRYSTAL LAYER

CROSS-REFERENCE TO THE RELATED APPLICATION

This is a continuation-in-part of U.S. patent application Ser. No. 07/780,469, filed Oct. 22, 1991 now U.S. Pat. No. 5,334,277.

BACKGROUND OF THE INVENTION

1. Field of the Invention

The present invention relates to a method of depositing a gallium nitride-based III-V Group compound semiconductor crystal layer by the metalorganic chemical vapor deposition or metalorganic vapor phase epitaxy technique.

2. Description of the Related Art

Gallium nitride-based III-V Group compound semiconductor materials such as gallium nitride (GaN), gallium aluminum nitride (GaAlN), indium gallium nitride (InGaN), and indium aluminum gallium nitride (InAlGaN) are promising as materials for light-emitting devices. Recently, these compound semiconductors are grown by the metalorganic chemical vapor deposition (MOCVD), or metalorganic vapor phase epitaxy (MOVPE) technique.

However, gallium nitride-based III-V Group semiconductor materials having a good crystal quality can not be obtained efficiently by the conventional methods by the MOCVD or MOVPE technique.

The MOCVD or MOVPE technique has been discussed in many documents, including U.S. Pat. No. 4,368,098; Appl. Phys. Lett. 48(5), 3 Feb. 1986, pp. 353–355; Journal of Crystal Growth 68 (1984), pp. 163–168; Journal of Crystal Growth 93 (1988), pp. 216–219; Appl. Phys. Lett. 48(13), 31 Mar. 1986, pp. 870–872; Inst. Phys. Conf. Ser. No. 63: Chapter 10, 1981, pp. 479–484; and Journal of Crystal Growth 96 (1989), pp. 13–18.

Generally, the growth of gallium nitride-based III-V Group compound semiconductors such as GaN by MOVPE is effected through reaction of a gaseous organogallium material and a gaseous nitrogen-containing material on a heated substrate under atmospheric pressure. The substrate must be heated at a temperature at which the reactive gases can thermally decompose, so as to effect the reaction of the gaseous reactive materials on the surface of the substrate. Further, the gaseous reactive materials should be allowed to flow at high velocities, for example, 2 m/sec or more, in order to form a desired semiconductor crystal. Otherwise, sufficient amounts of the reactive gases cannot reach the surface of the substrate due to a large heat convection current generated by the high temperature of the substrate.

The high flow velocity of the reactive gases requires the use of a small diameter gas supply tube, which results in the formation of a semiconductor layer having a very small diameter, or having a very narrow width along the direction of the gas flow. The entire surface of the substrate can not be covered with a semiconductor layer formed by one growing operation.

SUMMARY OF THE INVENTION

It is therefore an object of the present invention to provide a method of efficiently depositing a gallium nitride-based III-V Group compound semiconductor crystal layer with high crystal quality efficiently by the metalorganic chemical vapor deposition or metalorganic vapor phase epitaxy technique.

It is another object of the present invention to provide an improved metalorganic vapor phase epitaxy method which can efficiently produce a gallium nitride-based III-V Group compound semiconductor crystal layer with high crystal quality even under super-atmospheric pressure.

According to one aspect of the present invention, there is provided a method of depositing a gallium nitride-based III-V Group compound semiconductor crystal layer over a substrate by a metalorganic chemical vapor deposition technique, comprising the steps of:
  heating the substrate;
  supplying a reaction gas comprising a first gaseous organometallic material containing at least an organogallium compound, and a second gaseous material containing nitrogen, to a surface of the heated substrate in a direction parallel or oblique to the substrate; and
  growing the gallium nitride-based III-V Group compound semiconductor crystal layer on the heated substrate through reaction of the first gaseous material with the second gaseous material, while introducing a pressing gas substantially in a vertical direction toward said substrate to bring the reaction gas into contact with the entire surface of said substrate;
  wherein the growing step is performed under atmospheric pressure.

According to another aspect of the present invention, there is provided a method of depositing a gallium nitride-based III-V Group compound semiconductor crystal layer on a substrate by a metalorganic vapor phase epitaxy technique, comprising the steps of:
  heating the substrate;
  supplying a reaction gas comprising a first gaseous organometallic material containing at least an organogallium compound, and a second gaseous material containing nitrogen, to a surface of the heated substrate in a direction parallel or oblique to the surface of the substrate; and
  growing the gallium nitride-based III-V Group compound semiconductor crystal layer on the heated substrate through reaction of the first gaseous material with the second gaseous material, while introducing a pressing gas containing nitrogen substantially in a vertical direction toward the substrate to press the reaction gas against the entire surface of the substrate, to thereby effect the reaction on the entire surface of the substrate, under atmospheric pressure or a higher pressure.

In a preferred embodiment of the invention, the pressing gas is introduced at a gas velocity of 0.02 to 0.5 m/sec on the substrate.

The pressing gas is preferably introduced through a blow tube having a blow port and widened toward the blow port.

According to still another aspect of the invention, there is provided an apparatus for growing a GaN-based III-V Group compound semiconductor crystal layer, comprising:
  a reaction chamber;
  a susceptor provided in the reaction chamber, for supporting a substrate;

means for supplying a reaction gas parallel or obliquely to the surface of the substrate; and means for supplying a pressing gas toward the substrate surface to bring the reaction gas into contact with the substrate surface.

Preferably, the pressing gas supply means comprises a blow tube having a blow port, and the transverse size of the blow tube is increasingly enlarged toward the blow port.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a view for explaining the function of the pressing gas of the invention; and FIG. 2 shows an apparatus of the invention which can be suitably used for the practice of the method of the present invention.

DETAILED DESCRIPTION OF THE PREFERRED EMBODIMENTS

The present invention provides a method of depositing a GaN-based III-V Group compound semiconductor crystal layer on a substrate by the metalorganic chemical vapor deposition or metalorganic vapor phase epitaxy technique. GaN-based III-V Group compound semiconductors include gallium nitride (GaN), gallium aluminum nitride (GaAlN), indium gallium nitride (InGaN), and indium aluminum gallium nitride (InAlGaN). These semiconductors may be represented by the formula:

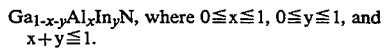

$Ga_{1-x-y}Al_xIn_yN$, where $0 \leq x \leq 1$, $0 \leq y \leq 1$, and $x+y \leq 1$.

In the present invention, a reaction gas comprising a first gaseous organometallic material containing an organogallium compound and a second gaseous material containing nitrogen is supplied parallel or obliquely to the surface of a heated substrate. A pressing gas is supplied downwards to the heated substrate surface to urge and press the reaction gas flowing parallel or obliquely to the substrate against the heated substrate surface. The GaN-based III-V Group compound semiconductor crystal grows on the heated substrate surface through the reaction of the first and second gaseous materials. Without the pressing gas, a sufficient amount of the reaction gas cannot contact the substrate surface due to a large heat convection current generated by the high temperature of the substrate, which is required to react the first and second gaseous materials on the substrate. The large heat convection current directs the reaction gas upwards away from the substrate.

FIG. 1 schematically shows the function of the pressing gas of the present invention. As shown, the reaction gas is supplied parallel to a substrate 12 placed on a susceptor 14. The pressing gas is supplied from above the substrate 12 vertically down to the substrate, and urges and directs the reaction gas flow to contact the entire surface of the substrate 12.

The first gaseous material contains at least an organogallium compound such as trimethylgallium, triethylgallium, or a mixture thereof. The first gaseous material may further contains an organic compound of a Group III element, other than organogallium compounds. Examples of such an organic compound includes an organoaluminum compound such as trimethylaluminum, triethylaluminum or a mixture thereof, an organoindium compound such as trimethylindium, triethylindium, or a mixture thereof.

The second gaseous material contains nitrogen. One example is ammonia gas.

The reaction gas may contain a gaseous p-type or n-type dopant source, such as diethylzinc, arsine, phosphine, silane, hydrogen selenide and/or methane.

The pressing gas should not substantially interfere with the reaction of the gaseous reactants in the reaction gas to produce a GaN-based III-V Group compound semiconductor. Examples of the pressing gas include hydrogen gas, nitrogen gas, ammonia gas, helium gas, argon gas or a mixture thereof. The most preferred pressing gas is nitrogen gas.

The pressing gas of the invention is preferably supplied such that its flow or stream tube is increasingly enlarged toward the substrate.

FIG. 2 schematically shows an apparatus 20 suitably used to carry out the method of the present invention.

As shown in FIG. 2, the apparatus 20 has a reaction chamber 22 made of, for example, stainless steel.

A susceptor 24 is arranged in the chamber 22 to place a substrate 40 thereon substantially horizontally. The substrate 40 is loaded/unloaded through a load/unload port, not shown, arranged in the chamber 22, as is well known in the art. The susceptor 24 is a round column having a diameter of, for example, 30 to 100 mm and a height of, for example, 10 to 30 mm. The susceptor 24 is made of a high heat-resistant material which does not contaminate the gases in the chamber 22 upon heating. Such a material includes carbon surface-coated with silicon carbide.

A shaft 26 is fixed to the center of the lower surface of the susceptor 24, and air-tightly extends outside the chamber 22. The shaft 26 can be rotated by any suitable rotating means, not shown, to rotate the susceptor 24, and hence the substrate 40, during the growth operation.

A heater is arranged to heat the susceptor 24, and hence the substrate 40, to a temperature suitable to grow a desired GaN-based III-V Group compound semiconductor crystal layer on the substrate, e.g., about 1,000° C. or more. In FIG. 2, such a heater 28 is provided close to, but away from, the lower surface of the susceptor 24. The heater 28 is controlled to heat the susceptor 24 to the required temperature by a temperature sensor (not shown) incorporated in the susceptor 24, and ON/OFF control or supply current control, not shown.

A first cylindrical blow tube 30 is air-tightly inserted into the chamber 22 parallel or slightly obliquely to the surface of the substrate 40, and extends near the substrate 40. The reaction gas is blown through the first blow tube 30 parallel or slightly obliquely to the substrate surface, together with a carrier gas such as hydrogen gas. The reaction gas is preferably blown substantially parallel to the surface of the substrate 40. The inner diameter of the first blow tube is usually about 20 mm to 100 mm. Preferably, the flow velocity of the reaction gas is high, and is usually 0.01 m/sec or more, preferably 0.2 m/sec to 1 m/sec.

A second blow tube 32, through which the pressing gas is supplied into the chamber 22, is provided above the substrate 40 through the chamber 22. The second blow tube 32 has a blow port 32a having an opening size substantially the same as the size of the entire surface of the substrate 40 on which the desired compound semiconductor crystal is grown. The blow port 32a closely faces the substrate, preferably 5 mm to 50 mm, more preferably 10 mm to 30 mm, away from the substrate surface. The transverse size, such as a diameter, of the blow tube 32 is increasingly enlarged toward the blow port 32a. The inclination angle of the inner wall of the blow tube 32 is preferably 20 degrees or lees, more preferably 10 degrees or less with respect to the axis of the blow tube 32.

The second blow tube 32 is most preferably of a conical shape, though it may be of an elliptically conical shape, or a pyramidal shape whose polygonal corners are preferably rounded. The gas can flow through the second blow tube 32 of such a shape as a uniform laminar flow.

At the lower portion of the chamber 22, an exhaust tube 34 may be provided, if desired, through which the gases inside the chamber 22 may be exhausted by means of an exhaust pump, not shown.

As has been described above, the pressing gas blown-in through the second blow tube 32 urges and presses the reaction gas flowing parallel or obliquely to the substrate 40, against the entire substrate surface, thereby effecting the reaction of the reactants in the reaction gas to grow the desired compound semiconductor crystal layer on the entire substrate surface. The flow velocity of the pressing gas is preferably 0.02 to 0.5 m/sec on the substrate 40. It is suppressed by the pressing gas that the reaction gas rises upwards away from the substrate 40 by the heat convection current generated by the high temperature of the substrate 40. Thus, a high-crystallinity GaN-based III-V Group compound semiconductor can be grown over the entire surface of the substrate 40. In addition, the second blow tube 32 is not contaminated with the reaction product or by-product such as gallium metal even when the apparatus is repeatedly used. Accordingly, if the blow tube 32 is made of a transparent material such as quartz glass, it may also function as a "monitor window" over a long period of time, through which the growth state of the compound semiconductor material can be observed. For this purpose, an infrared intensity detector 36 is provided outside the apparatus 20. The detector 36 detects an intensity of the infrared ray radiated from the semiconductor crystal layer growing on the substrate 40. The intensity of the infrared light from the growing epitaxial layer oscillates due to the interference effects by the multiple reflection of the infrared light, and the thickness of the layer can be calculated from the oscillation period of this interference.

In operation, a substrate 40 such as a sapphire substrate (C face) is placed on the susceptor 24. The susceptor 24 is heated with the heater 28 to a temperature of, for example, 1,000° C. to 1050° C. to heat the substrate 40 to that temperature. The susceptor 24, and hence the substrate 40, is rotated by driving the shaft 26. The reaction gas is supplied in the chamber 22 through the first blow tube 30 in a direction parallel to the substrate 40, and the pressing gas is supplied into the chamber 22 through the second blow tube 32 to press the reaction gas against the substrate 40. The reactants of the reaction gas react with each other to grow the desired GaN-based III-V Group compound semiconductor crystal layer on the entire substrate surface. As originally apparent, the growth operation is conducted at atmospheric pressure or a higher pressure. Preferably, the growth operation is conducted under a pressure higher than atmospheric pressure, i.e., a super-atmospheric pressure established by the introduction of the pressing nitrogen gas, to suppress the decomposition of the GaN-based semiconductor material. More specifically, the growth operation is conducted under a pressure of 770 mmHg to 900 mmHg.

The present invention will be described below by way of Examples which follow. In the following Examples, the apparatus of FIG. 2 was used to grow a GaN-based III-V Group compound semiconductor crystal layer on a sapphire substrate having a diameter of 2 inches. The horizontally arranged blow tube 30 had an inner diameter of about 10 mm, and the conical blow tube 32 had the blow port 32a having a diameter of about 60 mm.

EXAMPLE 1

GaN was grown on a sapphire substrate by the following steps.

(I) A washed sapphire substrate 40 was placed on the susceptor 24.

(II) Air in the chamber 22 was exhausted by the exhaust pump and replaced by $H_2$.

(III) Thereafter, the susceptor 24 was heated up to 1,150° C. while $H_2$ gas was supplied from the blow tube 30 and the blow tube 32.

(IV) This state was maintained for 10 minutes to remove an oxide film on the surface of the sapphire substrate.

(V) The reaction temperature of the substrate was decreased to 1,000° C., and the substrate was left to stand until the temperature was stabilized.

(VI) Subsequently, hydrogen and nitrogen gases were supplied from the blow tube 32, and ammonia gas and hydrogen gas were supplied from the blow tube 30.

The flow rate of both of the hydrogen and nitrogen gases supplied from the blow tube 32 into the chamber 22 was 5 liters/min. The flow rates of the ammonia gas and the hydrogen gas blown from the blow tube 30 were 5 liters/min and 1 liter/min, respectively. This state was maintained until the temperature was stabilized.

(VII) Thereafter, trimethylgallium (TMG) gas was blown from the blow tube 30, in addition to the ammonia gas and the hydrogen gas. The flow rate of the TMG gas was $5.4 \times 10^{-5}$ mol/min. Vapor-growth of a GaN layer was started in this state and continued for 60 minutes. In this vapor-growth step, the susceptor 24 was rotated at 5 rpm. During the growth step, the inner pressure of the chamber 22 was 760 Torrs.

The substrate was removed from the chamber 22, and the thickness distribution of the GaN layer was measured by a Nomarski microscope. It was found that the thickness of the GaN crystal layer fell within the range of 4 $\mu m \pm 10\%$ over the entire surface, and was very uniform.

The carrier concentrations, indicating the purity of the GaN obtained in Example 1, was $1 \times 10^{18}/\text{cm}^3$, and its electron mobility was 250 cm$^2$/V·sec. Generally, it is assumed that when the carrier concentration is low in Hall measurement, the concentration of an impurity serving as carrier's is low or the number of lattice defects serving as carriers is small. In addition, it is generally assumed that N (nitrogen) vacancies are sources of n-type carriers in GaN crystals, and that the electron carrier concentration is $2 \times 10^{19}/\text{cm}^3$ and the electron mobility is 50 cm$^2$/V·sec. Therefore, since the value of electron mobility of GaN obtained by the apparatus of the present invention is five times that of the general mobility, this GaN is excellent in crystallinity. It is assumed that this good crystallinity is obtained by an effect of the pressure gas. That is, the reaction gas is efficiently brought into contact with the substrate by the pressing gas to cause growth of the GaN layer. In addition, the pressing gas prevents N from being released from grown GaN by decomposition caused by the heated substrate. In conventional methods, N vacancies are formed upon releasing of N from GaN. In the method of the present invention, however, the crystallinity is improved because the number of N vacancies is remarkably decreased.

The blow tube 32 was not contaminated at all. In addition, even after the reaction was carried out twice or more by the apparatus, no Ga metal adhered on the surface of the grown GaN crystal layer.

EXAMPLE 2

InGaN was vapor-grown on the surface of a sapphire substrate by the following steps.

(I) A sapphire substrate washed well was placed on the susceptor 24.

(II) Air in the chamber 22 was fully exhausted and replaced by H$_2$.

(III) While H$_2$ gas was flowed into the chamber 22 from the blow tube 30 and the blow tube 32, the temperature of the substrate 40 was increased to 1,150° C. and maintained for 10 minutes.

(IV) Thereafter, the temperature of the substrate 40 was slowly decreased to 550° C.

(V) Hydrogen and nitrogen gases were blown from the blow tube 32, and ammonia gas, hydrogen gas, TMG gas, and trimethylindium (TMI) gas were blown from the blow tube 30.

The flow rate of both of the hydrogen and nitrogen gases blown from the blow tube 32 was 5 liters/min.

The flow rates of the ammonia gas, the hydrogen gas, the TMG gas, and the TMI gas were 5 liters/min, 1 liter/min, $2.2 \times 10^{-6}$ mol/min, and $1.5 \times 10^{-7}$ mol/min, respectively.

This state was maintained for 120 minutes to vapor-grow a mixed crystal film of In$_{0.06}$Ga$_{0.94}$N on the surface of the sapphire substrate 40. During the growth step, the inner pressure of the chamber 22 was 760 Torrs.

After the vapor-growth, the substrate 40 was removed from the chamber 22, and its thickness was measured. It was found that InGaN having a thickness of 2 $\mu$m±10% was grown on the entire surface of the 2-inch diameter substrate.

When Hall measurement was performed for this sample, the measurement was impossible because the resistivity was over $10^8$ Ω·cm.

Since the Hall measurement was almost impossible because the resistivity of the InGaN crystal was very high, the photoluminescence of InGaN was measured to evaluate its crystallinity. Since luminescence of 440 nm was difficult to confirm in the InGaN crystal at room temperature, the luminescence was measured by decreasing the temperature to that of liquid nitrogen or liquid helium. Generally, the better the crystallinity is, the higher is the temperature at which luminescence can be measured. According to the present invention, however, luminescence of 440 nm was observed at room temperature. This indicates that the crystallinity of the semiconductor crystal film obtained by the method of the present invention is very good.

EXAMPLE 3

A device which suitably utilizes the semiconductor crystal layer obtained by the present invention is mainly a light-emitting device, and particularly, a blue light-emitting diode and a blue laser diode. An example of the diode will be described below.

Crystal growth was performed following the same procedures as in Example 1 except that in the step (VII) in Example 1, after a GaN layer was grown for 60 minutes, diethylzinc (DEZ) was flowed, in addition to the TMG gas, at $5.0 \times 10^{-5}$ mol/min to vapor-grow a Zn-doped GaN layer for six minutes.

As a result, a wafer having a structure in which a 4 $\mu$m thick undoped GaN layer was formed on the sapphire substrate and a 0.4 $\mu$m thick Zn-doped GaN layer was laminated thereon was manufactured.

This wafer was cut into a 0.5 mm × 0.5 mm square piece by a dicing saw, and Al and In electrodes were formed on the Zn-doped GaN layer and the undoped GaN layer, respectively. The resultant square sample was placed on a lead frame and subjected to wire bonding, and resin molding was performed to manufacture a light-emitting diode.

when the light-emitting diode having the above structure was caused to emit light at a current of 10 mA, the emission wavelength of the diode was 480 nm, and its luminance was 20 mcd.

EXAMPLE 4

A GaN layer was grown on a sapphire substrate by the following steps.

STEP 1: A washed sapphire substrate (C face) having a diameter of 2 inches was placed on the susceptor 24.

STEP 2: The air in the chamber 22 was fully exhausted, and replaced with hydrogen.

STEP 3: Then, the susceptor, and hence the substrate 40, was heated to 1,150° C., while hydrogen gas was supplied from the blow tube 30 and also from the blow tube 32 for 10 minutes to remove the oxide film on the sapphire substrate 40.

STEP 4: Then, the temperature of the substrate was decreased down to 1,000° C., and the substrate was allowed to stand until the temperature was stabilized.

STEP 5: Thereafter, nitrogen gas (pressing gas) was introduced through the blow tube 32, and ammonia and hydrogen gases was introduced through the blow tube 30. The flow rate of the pressing nitrogen gas was adjusted to 20 liters/min. The flow rates of the ammonia and hydrogen gases were 5 liters/min., and 1 liter/min. respectively. These gases were blown until the temperature was stabilized. During this period, the inner pressure of the chamber 22 was measured by a pressure meter provided in the chamber 22. It was 780 Torrs. Incidentally, the inner pressure of the chamber 22 was 760 Torr when the nitrogen was flowed at a flow rate of 7 liters/min. instead of 20 liters/min.

STEP 6: Then, trimethylgallium (TMG) gas was further supplied into the chamber 22 from the blow tube 30, in addition to the ammonia and hydrogen gases, to grow a GaN layer on the substrate surface for 60 minutes. The flow rate of the TMG gas was $5.4 \times 10^{-5}$ mol/min. During the growth, the susceptor 24, and hence the substrate 40 was rotated at 5 rpm.

The substrate was then removed from the chamber 22, and the thickness distribution of the GaN layer grown over the entire substrate surface was measured by a Nomarski microscope. The layer thickness was found to fall within a range of 4 $\mu$m$\pm$10%, and was very uniform.

The carrier concentration of the GaN obtained above was $1 \times 10^{17}$/cm$^3$, and the electron mobility was 330 cm$^2$/V·sec (about 7 times as high as that of the conventional GaN), indicating that the crystallinity of the GaN obtained in this Example was very excellent. The pressing nitrogen gas further contributed to set the partial pressure of nitrogen within the chamber 22 during the growth step at more than the vapor pressure of GaN, further suppressing the decomposition of GaN, to provide the GaN layer having an excellent crystallinity as described above.

Further, the blow tube 32 was not contaminated at all, even when the procedures of Example 4 were repeated twice or more.

EXAMPLE 5

The STEPS 1-3 were followed as in Example 4.

Then, the substrate temperature was gradually lowered to 520° C. Subsequently, nitrogen gas (pressing gas) was supplied through the blow tube 32, and ammonia, hydrogen and TMG gases were supplied through the blow tube 30, for 1 minute, to form a GaN buffer layer on the substrate 40. The flow rate of the nitrogen gas was 10 liters/min. The flow rates of the ammonia, hydrogen and TMG gases were 5 liters/min., 1 liter/min., and $2 \times 10^{-5}$ mol/min., respectively. During the growth, the inner pressure of the chamber 22 was 770 Torrs.

Thereafter, only the supply of the TMG gas was stopped, and the temperature of the substrate 40 was increased to 1,000° C. while flowing the other gases. Then, TMG gas was supplied at a flow rate of $5.4 \times 10^{-5}$ mol/min. through the blow tube 30, in addition to the ammonia and hydrogen gases, for 60 minutes, to grow a GaN crystal layer on the GaN buffer layer, while rotating the susceptor at 5 rpm.

The grow GaN crystal layer was observed by a Nomarski microscope. It was found that the GaN crystal layer was formed on the entire surface of the substrate, and the surface of the crystal layer was mirror-like. The thickness of the GaN crystal layer was 5 $\mu$m$\pm$10%.

Further, the Hall measurement was performed. The carrier concentration was $1 \times 10^{16}$/cm$^3$, and the electron mobility was 1,000 cm$^2$/V·sec, indicating that the crystallinity of the GaN layer was very high.

Further, the blow tube 32 was not contaminated at all, even when the procedures of Example 5 were repeated twice or more.

EXAMPLE 6

The STEP 1 to 3 were followed as in Example 4, and then a GaN layer was grown as in Example 5 to a thickness of 5 $\mu$m.

Subsequently, the substrate temperature was slowly lowered to 800° C. Then, nitrogen gas (pressing gas) was supplied through the blow tube 32, and ammonia, hydrogen TMG and trimethylindium (TMI) gases were supplied through the blow tube 30, for 60 minutes, to grow InGaN layer on the GaN buffer layer. The flow rate of the pressing nitrogen gas was 20 liters/min. The flow rates of the ammonia, hydrogen, TMG and TMI gases were 5 liters/min., 1 liter/min., $2.2 \times 10^{-6}$ mol/min., and $1.5 \times 10^{-7}$ mol/min., respectively. During the growth of the InGaN layer, the inner pressure of the chamber 22 was 780 Torrs.

It was found that the InGaN layer was formed on the entire surface of the substrate, and had a thickness of 0.2 $\mu$m$\pm$10%.

The Hall measurement indicated that the resistivity of the InGaN layer was 0.1 $\Omega$·cm.

Further, photoluminescence of the InGaN layer was measured. Conventionally, it has been difficult to observe an interband photoemission at 400 nm at room temperature, and the photoemission has been measured with the temperature lowered to a cryogenic temperature of liquid nitrogen or liquid helium. The interband photoemission can be observed at a higher temperature for a InGaN crystal having a better crystallinity. The interband photoemission at 400 nm of the InGaN crystal layer obtained in this Example could be observed at room temperature, and its half-band width was 10 nm, indicating the superior crystallinity of the InGaN layer.

What is claimed is:

1. A method of depositing a gallium nitride-based III-V Group compound semiconductor crystal layer over a substrate by a metalorganic chemical vapor deposition technique, comprising the steps of:
   heating the substrate;
   supplying a reaction gas comprising a first gaseous material containing an organogallium compound, and a second gaseous material containing nitrogen, to a surface of the heated substrate in a direction parallel or oblique to said substrate; and
   growing the gallium nitride-based III-V Group compound semiconductor crystal layer on the heated substrate through reaction of said first gaseous material with said second gaseous material, while introducing a pressing gas substantially in a vertical direction toward said substrate to bring said reaction gas into contact with the surface of said substrate;
   said growing step being performed under atmospheric pressure.

2. The method according to claim 1, wherein said pressing gas is introduced at a flow velocity of 0.02 to 0.5 m/sec on said substrate.

3. The method according to claim 1, wherein said III-V Group compound semiconductor is represented by the formula $Ga_{1-x-y}Al_xIn_yN$, wherein $0 \leq x \leq 1$, $0 \leq y \leq 1$, and $x+y \leq 1$.

4. A method of depositing a gallium nitride-based III-V Group compound semiconductor crystal layer on a substrate by a metalorganic vapor phase epitaxy technique, comprising the steps of:
   heating the substrate;

supplying a reaction gas comprising a first gaseous material containing at least one Group III element, including an organogallium compound, and a second gaseous material containing nitrogen to a surface of the heated substrate in a direction parallel or oblique to said substrate; and growing the gallium nitride-based III-V Group compound semiconductor crystal layer on the heated substrate through reaction of said first gaseous material with said second gaseous material, while introducing a pressing gas containing nitrogen substantially in a vertical direction toward said substrate, bringing said reaction gas into contact with the surface of said substrate to effect said reaction on said substrate under atmospheric pressure or a higher pressure.

5. The method according to claim 4, wherein said growing step is carried out under a super-atmospheric pressure.

6. The method according to claim 5, wherein said pressing gas is introduced through a blow tube which has a blow port, and whose transverse size is increasingly enlarged toward the blow port.

7. The method according to claim 5, wherein said pressing gas is introduced at a flow velocity of 0.02 to 0.5 m/sec on said substrate.

8. The method according to claim 5, wherein said super-atmospheric pressure is achieved by the introduction of said pressing gas.

9. The method according to claim 5, wherein said first gaseous material comprises trimethylgallium or triethylgallium.

10. The method according to claim 9, wherein said second gaseous material comprises ammonia.

11. The method according to claim 10, wherein said first gaseous material further comprises trimethylaluminum, triethylaluminum, trimethylindium, triethylindium or a mixture thereof.

12. The method according to claim 5, wherein said pressing gas comprises nitrogen gas.

13. The method according to claim 5, wherein said substrate comprises sapphire.

* * * * *